(12) United States Patent
Wong et al.

(10) Patent No.: US 8,384,183 B2
(45) Date of Patent: Feb. 26, 2013

(54) INTEGRATED HALL EFFECT ELEMENT HAVING A GERMANIUM HALL PLATE

(75) Inventors: Harianto Wong, Southborough, MA (US); William P. Taylor, Amherst, NH (US); Ravi Vig, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 343 days.

(21) Appl. No.: 12/708,855

(22) Filed: Feb. 19, 2010

(65) Prior Publication Data

US 2011/0204460 A1    Aug. 25, 2011

(51) Int. Cl.
*H01L 21/00* (2006.01)

(52) U.S. Cl. . 257/488; 257/557; 257/627; 257/E21.544; 257/E27.005; 257/E29.323; 438/299; 438/300; 438/303

(58) Field of Classification Search .......... 257/420–427, 257/488, 557, 627, E21.544, 27.005, 29.323, 257/43.002–43.007
See application file for complete search history.

(56) References Cited

U.S. PATENT DOCUMENTS

| | | | |
|---|---|---|---|
| 4,578,692 A * | 3/1986 | Higgs et al. ................... 257/420 |
| 4,795,529 A | 1/1989 | Kawasaki et al. |
| 4,985,114 A | 1/1991 | Okudaira et al. |
| 5,241,197 A * | 8/1993 | Murakami et al. ............ 257/192 |
| 5,357,119 A * | 10/1994 | Wang et al. ..................... 257/18 |
| 5,474,650 A | 12/1995 | Kumihashi et al. |
| 5,498,312 A | 3/1996 | Laermer et al. |
| 5,501,893 A | 3/1996 | Laermer et al. |
| 5,618,379 A | 4/1997 | Armacost et al. |
| 5,646,527 A * | 7/1997 | Mani et al. .................... 324/251 |
| 6,051,503 A | 4/2000 | Bhardwaj et al. |
| 6,284,148 B1 | 9/2001 | Laermer et al. |
| 6,303,512 B1 | 10/2001 | Laermer et al. |
| 6,720,268 B1 | 4/2004 | Laermer et al. |
| 6,937,434 B2 * | 8/2005 | Takahashi ..................... 360/112 |
| 6,951,824 B2 | 10/2005 | Fischer et al. |
| 6,974,709 B2 | 12/2005 | Breitschwerdt et al. |
| 7,015,557 B2 * | 3/2006 | Kilian et al. .................. 257/421 |
| 7,052,623 B1 | 5/2006 | Becker et al. |
| 7,285,228 B2 | 10/2007 | Laermer et al. |
| 7,288,485 B2 | 10/2007 | Breitschwerdt et al. |
| 7,626,377 B2 * | 12/2009 | Kilian et al. .............. 324/117 H |
| 7,768,083 B2 * | 8/2010 | Doogue et al. ................ 257/422 |
| 7,772,661 B2 * | 8/2010 | Kilian .......................... 257/421 |
| 2003/0234429 A1 | 12/2003 | Johnson et al. |
| 2005/0007694 A1 * | 1/2005 | Takahashi ..................... 360/112 |

(Continued)

FOREIGN PATENT DOCUMENTS

WO   WO 2008/126664 A1   10/2008
WO   WO 2011/102923 A1   8/2011

OTHER PUBLICATIONS

PCT Search Report and Written Opinion of the ISA dated May 17, 2011 for PCT/US2011/020619; 7 pages.

(Continued)

*Primary Examiner* — Michael LeBentritt
(74) *Attorney, Agent, or Firm* — Daly, Crowley, Mofford & Durkee, LLP

(57) ABSTRACT

An integrated circuit and a method of making the integrated circuit provide a Hall effect element having a germanium Hall plate. The germanium Hall plate provides an increased electron mobility compared with silicon, and therefore, a more sensitive Hall effect element.

36 Claims, 11 Drawing Sheets

U.S. PATENT DOCUMENTS

2005/0280107 A1* 12/2005 Cohen .......................... 257/421
2006/0284611 A1* 12/2006 Ishio ........................ 324/117 H
2009/0302426 A1   12/2009 Mclaughlin et al.
2010/0207222 A1*  8/2010 Wang ........................... 257/425
2011/0147865 A1*  6/2011 Erie et al. ..................... 257/421

OTHER PUBLICATIONS

International Preliminary Report on Patentability (Form PCT/IB/373) for PCT/US2011/020619, dated Aug. 21, 2012, 4 pages.

* cited by examiner

INTEGRATED HALL EFFECT ELEMENT HAVING A GERMANIUM HALL PLATE

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to Hall effect elements used for sensing magnetic fields, and, more particularly, to a Hall effect element that has a germanium Hall plate.

BACKGROUND OF THE INVENTION

As is known, Hall effect elements are used to sense a magnetic field, and can generate a voltage proportional to the magnetic field. Some conventional Hall effect elements are formed upon a silicon substrate in an integrated circuit manufacturing process. As is also known, there are different types of Hall effect elements, for example, planar Hall elements, vertical Hall elements, circular Hall elements, and Indium antimonide (InSb) sensors.

A conventional Hall effect element includes a metal field plate, a silicon Hall plate, and a plurality of conductive electrical contacts coupled to the Hall plate. Two of the electrical contacts can be used to drive the Hall effect element with a current or with a voltage, and two of the electrical contacts can be used to sense an output voltage, which is proportional to the magnetic field experienced by the Hall effect element.

It is often desirable to have a Hall effect element with a high sensitivity, i.e., that produces as large as possible a voltage when experiencing a given magnetic field. To this end, it is known that an electron mobility of the Hall plate tends to influence the sensitivity of a Hall effect element. In particular, a Hall plate with high mobility (e.g., electron or hole mobility) tends to result in a sensitive Hall effect element. However, it is known that silicon has limitations upon electron mobility.

SUMMARY OF THE INVENTION

The present invention provides a Hall effect element having a germanium Hall plate. The germanium Hall plate provides increased mobility compared with a silicon Hall plate of a conventional Hall effect element, and therefore, a more sensitive Hall effect element.

In accordance with one aspect of the present invention, a method of fabricating an integrated circuit includes fabricating a Hall effect element. The fabricating the Hall effect element includes forming an epi layer over a silicon substrate, forming a first insulating layer over the epi layer, forming a cavity in at least one of the first insulating layer, the epi layer, or the substrate, and depositing germanium into the cavity to form a germanium structure corresponding to a Hall plate of the Hall effect element.

In accordance with another aspect of the present invention, an integrated circuit includes a Hall effect element. The Hall effect element includes a silicon substrate having first and second opposing surfaces. The Hall effect element also includes an epi layer disposed over the first surface of the silicon substrate. The Hall effect element also includes a first insulating layer disposed over the epi layer and a cavity formed in at least one of the first insulating layer, the epi layer, or the substrate. The Hall effect element also includes a germanium structure comprised of germanium disposed within the cavity, wherein the germanium structure corresponds to a Hall plate of the Hall effect element.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
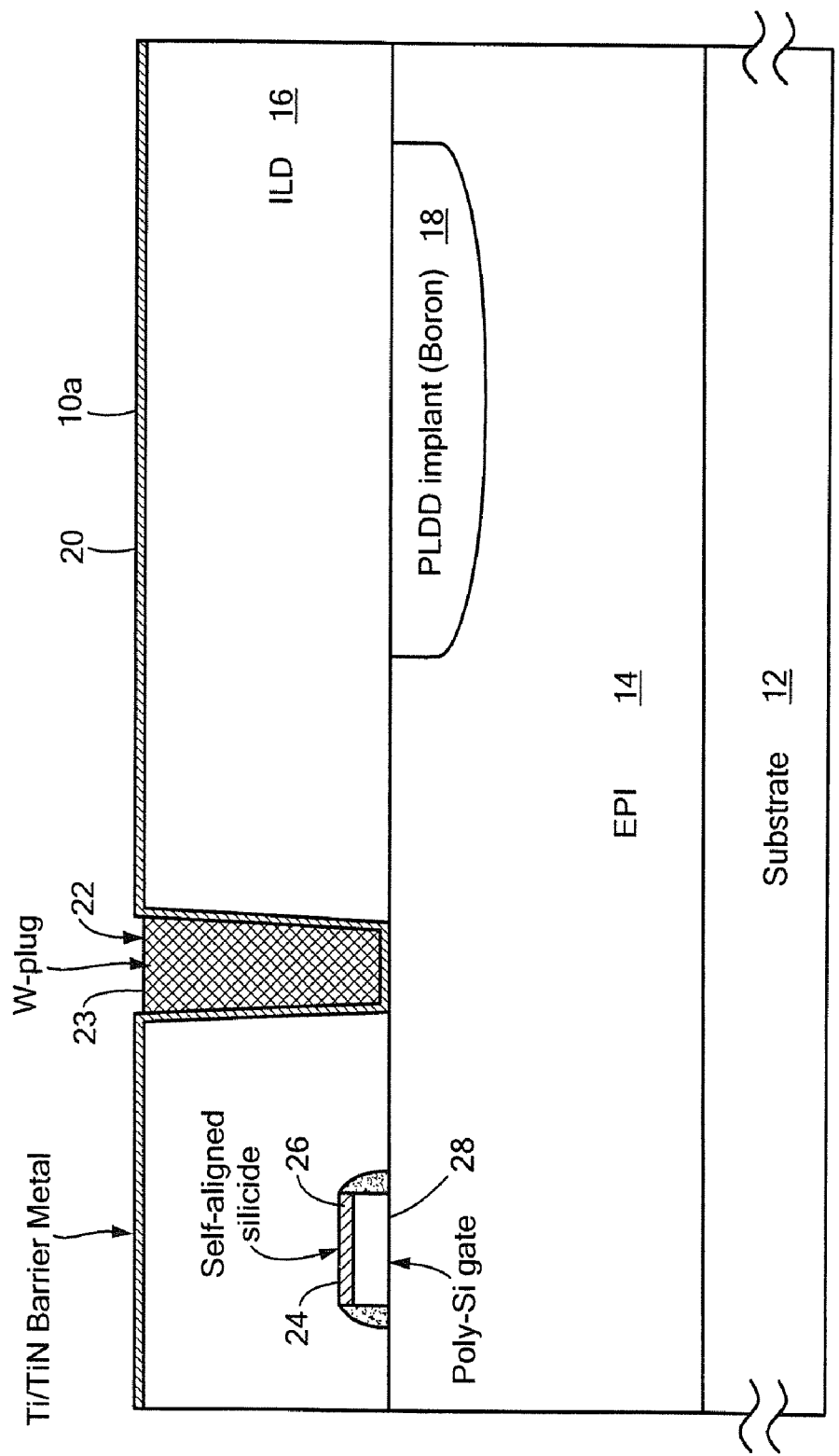
FIG. 1 is a cross-sectional view showing an intermediate structure representative of a processing step of fabricating an integrated circuit having a Hall effect element.

Before describing the present invention, some introductory concepts and terminology are explained. As used herein, the term " integrated circuit " is used to describe a circuit fabricated on a common substrate and that can include only a Hall effect element or that can include a Hall effect element along with other electronic components. The other electronic components can include active electronic components, for example, transistors or diodes, passive electronic components, for example, resistors, or both active and passive electronic components.

As used herein, the term "P-well" is used to describe a P-type doping, which can be implanted in a semiconductor, and which has a doping concentration of approximately $1\times10^{16}$ to approximately $5\times10^{16}$ ions/cm$^3$. Similarly, as used herein, the term "N-well" is used to describe an N-type doping, which has a doping concentration of approximately $1\times10^{16}$ to approximately $5\times10^{16}$ ions/cm$^3$.

As used herein, the terms "P−" or "P-minus" are used to describe a P-type doping, which can be implanted in a semiconductor, and which has a doping concentration of approximately $8\times10^{16}$ to approximately $2\times10^{17}$ ions/cm$^3$.

As used herein, the terms "P+" or "P-plus" are used to describe a P-type doping, which can be implanted in a semiconductor, and which has a doping concentration of approximately $1\times10^{19}$ to $5\times10^{19}$ ions/cm$^3$. Similarly, as used herein, the terms "N+" or "N-plus" are used to describe an N-type doping, which has a doping concentration of approximately $8\times10^{19}$ to approximately $2\times10^{20}$ ions/cm$^3$.

As used herein, the terms "P-type barrier layer" or "PBL" are used to describe a P-type doping, which can be implanted in a semiconductor, and which has a doping concentration of approximately $1\times10^{17}$ to approximately $3\times10^{17}$ ions/cm$^3$. As used herein, the terms "N-type barrier layer" or "NBL" are used to describe an N-type doping, which has a doping concentration of approximately $8\times10^{18}$ to approximately $2\times10^{19}$ ions/cm$^3$.

As used herein, the terms "N-epi" or simply "epi" are used to describe a semiconductor layer having an N-type doping, disposed over all of or a substantial portion of a semiconductor substrate. The N-epi layer is "grown" on the semiconductor substrate, and has a doping concentration of approximately $1\times10^{15}$ to approximately $3\times10^{15}$ ions/cm$^3$.

As used herein, the terms "lightly-doped drain" or simply "LDD" are used to describe a semiconductor layer having a doping, for example, in the drain or in the source region of a metal oxide semiconductor (MOS) transistor. An NLDD described herein is doped with N-type elements. A PLDD described herein is doped with P-type elements. The LDD layer can be implanted in the semiconductor, and has a doping concentration of approximately $8\times10'^{6}$ to approximately $2\times10^{17}$ ions/cm$^3$.

As used herein, the terms "polysilicon" or simply "poly" are used to describe a poly-crystalline semiconductor layer, which can be used, for example, as a conductive gate material in MOSFET and CMOS processing technologies. The poly layer can be deposited, for example, using low-pressure chemical vapor deposition (LPCVD) techniques. The poly layer can also be formed using other techniques. The poly layer can be heavily doped with N-type or P-type doping, and has a doping concentration of approximately $1\times10^{20}$ to approximately $5\times10^{20}$ ions/cm$^3$. The poly layer described herein is doped with N-type ions.

Before describing the present invention, it should be noted that reference is sometimes made herein to integrated circuit structures having a particular shape (e.g., rectangular or circular). One of ordinary skill in the art will appreciate, however, that the techniques described herein are applicable to a variety of sizes and shapes.

While certain integrated circuit structures having certain doping concentrations within certain doping concentration ranges are described above, it will be understood that in other integrated circuit manufacturing processes, similar structures can be formed with other doping concentrations within other doping concentration ranges.

Figure 6:
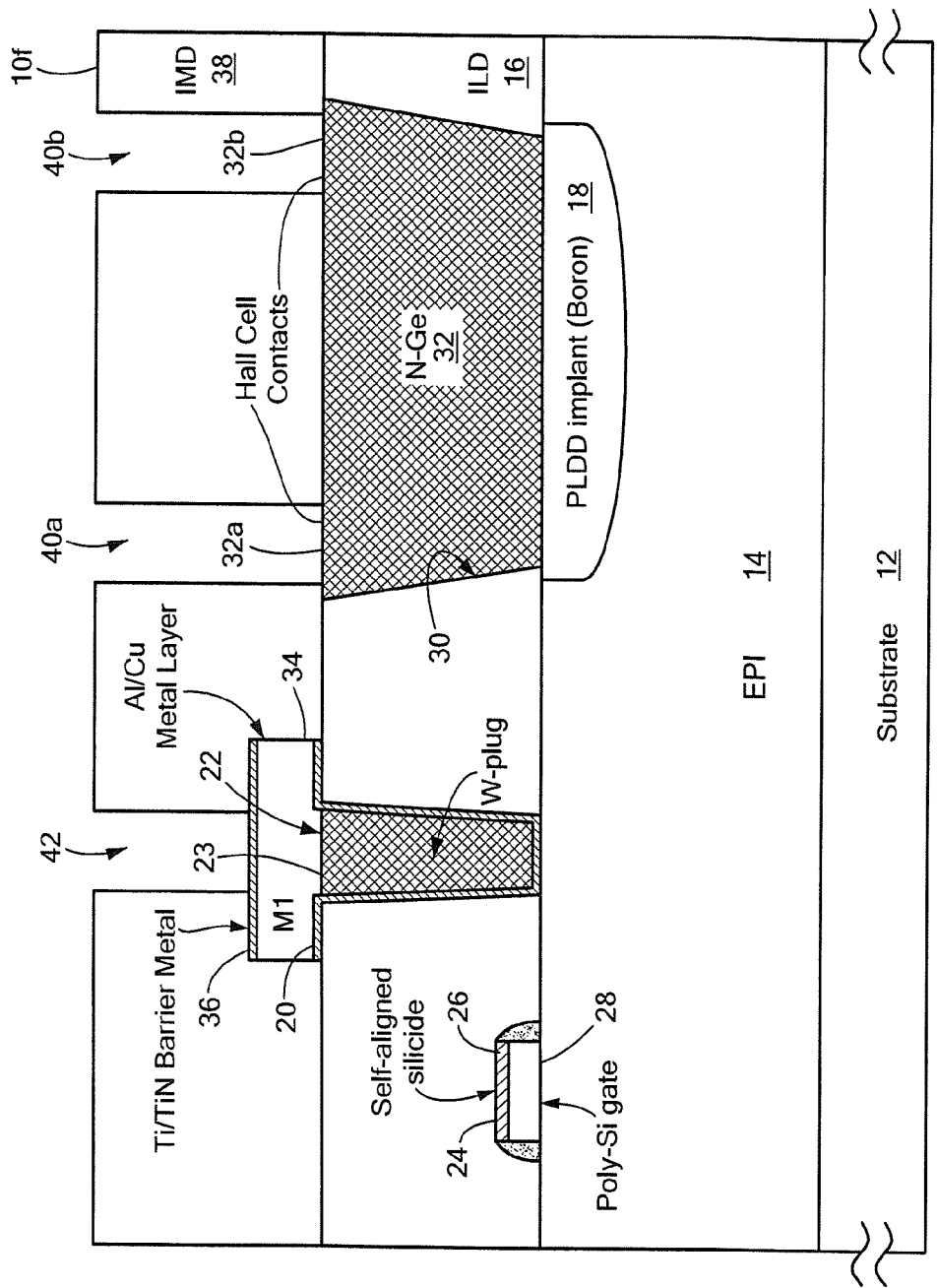
FIG. 6 is a cross-sectional view showing another intermediate structure representative of another processing step of fabricating the integrated circuit having the Hall effect element.
Figure 7:
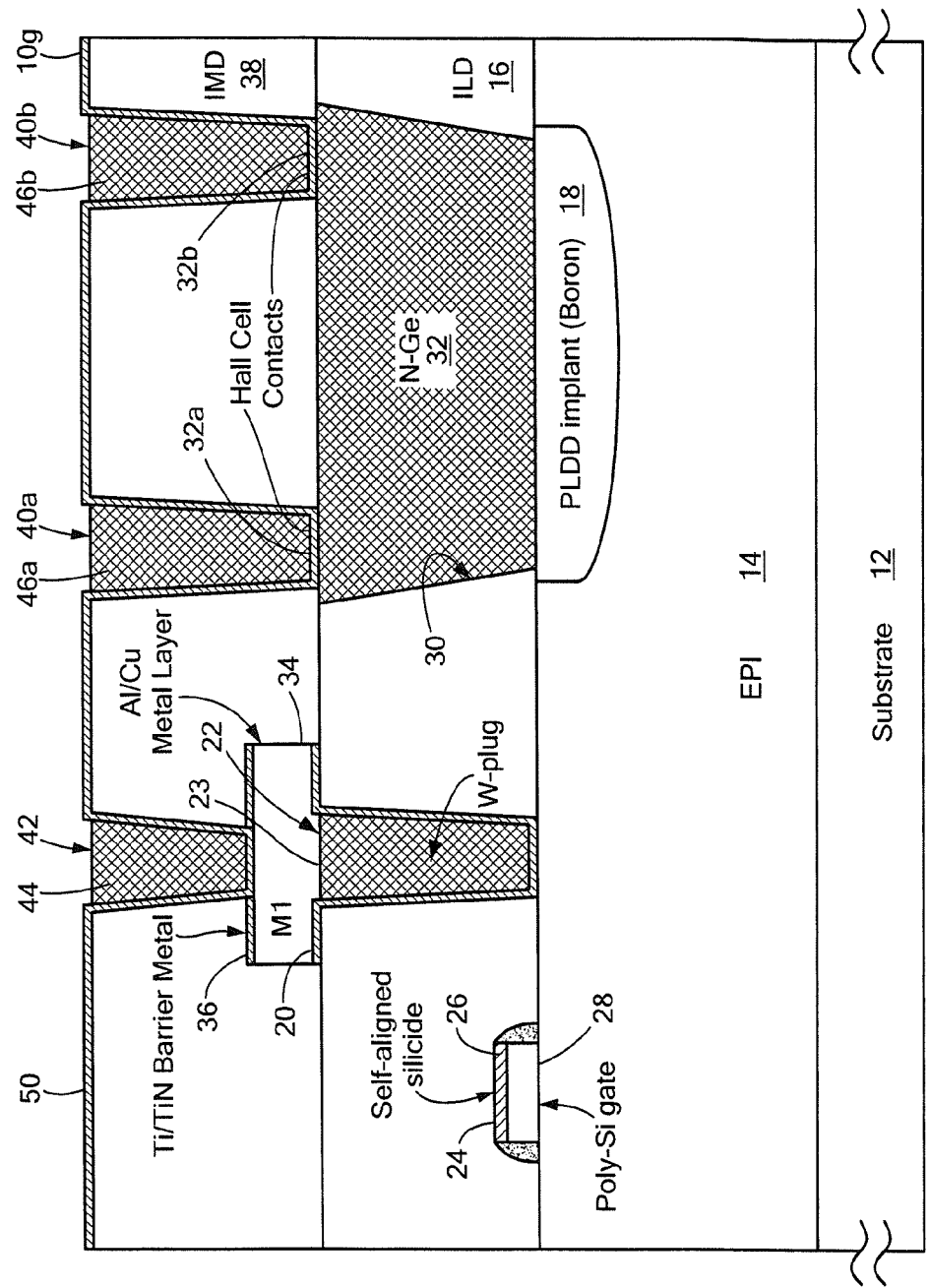
FIG. 7 is a cross-sectional view showing another intermediate structure representative of another processing step of fabricating the integrated circuit having the Hall effect element.
Figure 8:
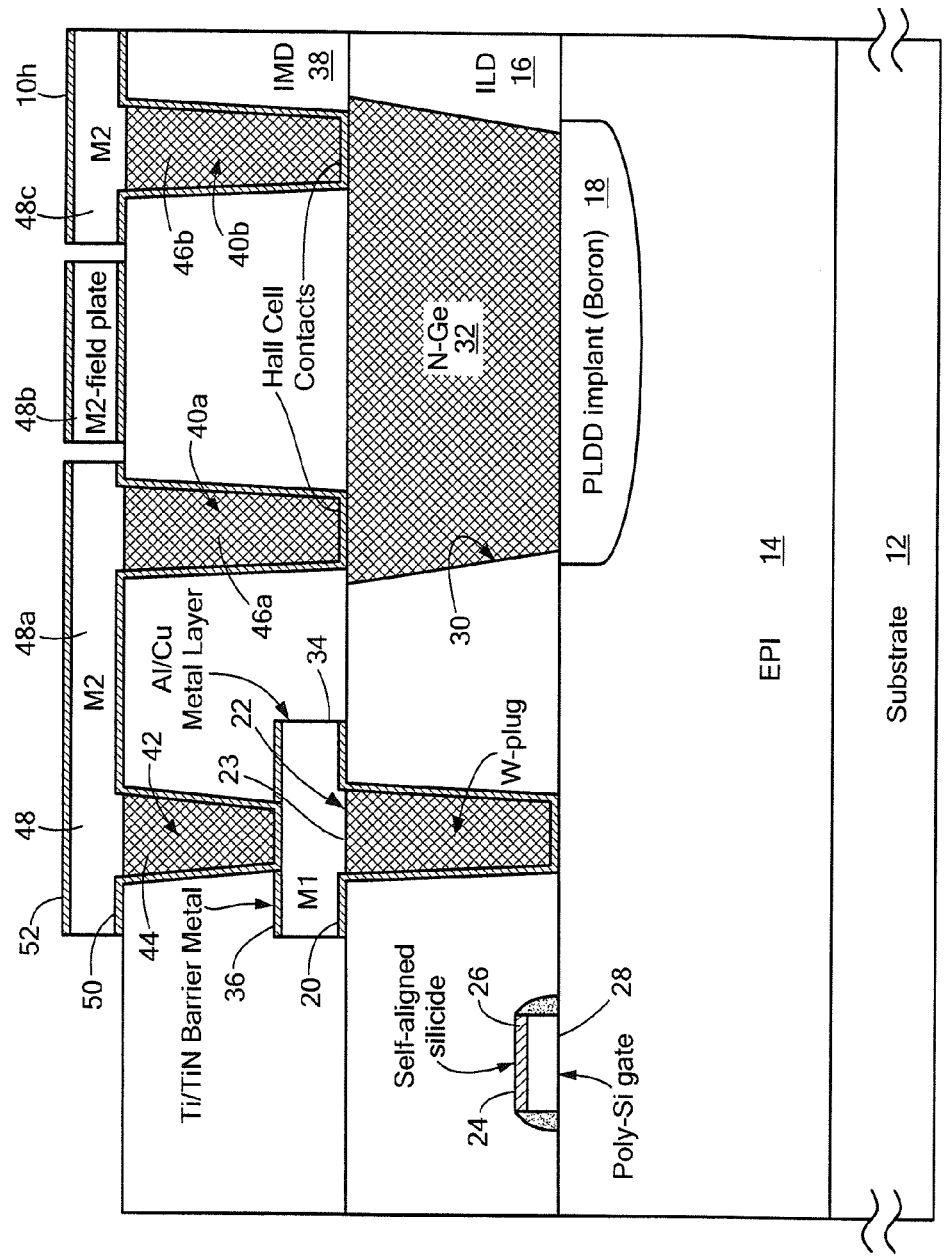
FIG. 8 is a cross-sectional view showing a structure representative of a last step of fabricating the integrated circuit having the Hall effect element, but prior to final packaging.
Figure 9:
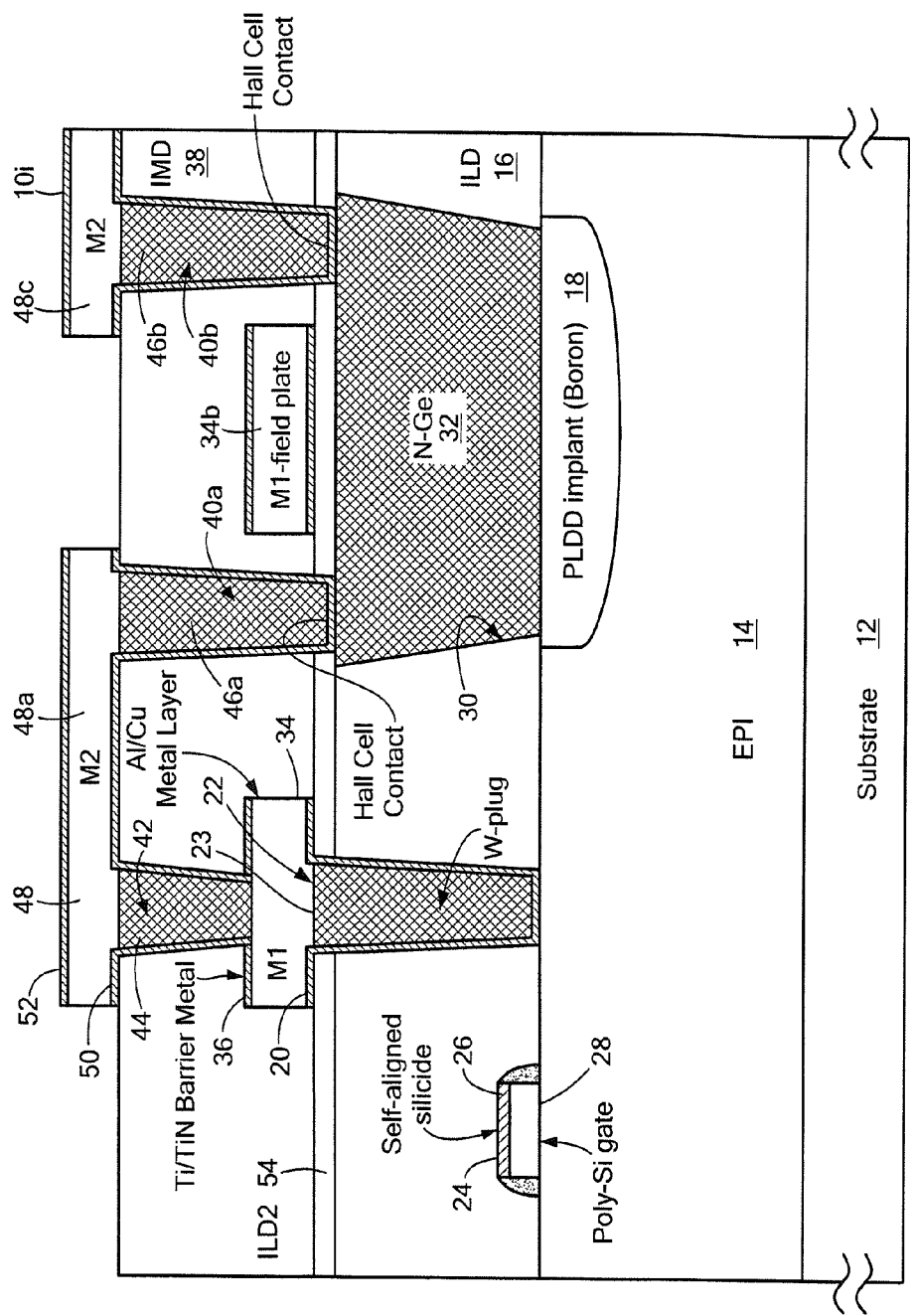
FIG. 9 is a cross-sectional view showing a structure representative of a last step of fabricating an integrated circuit, but prior to final packaging, having a first alternate embodiment of a Hall effect element.
Figure 10:
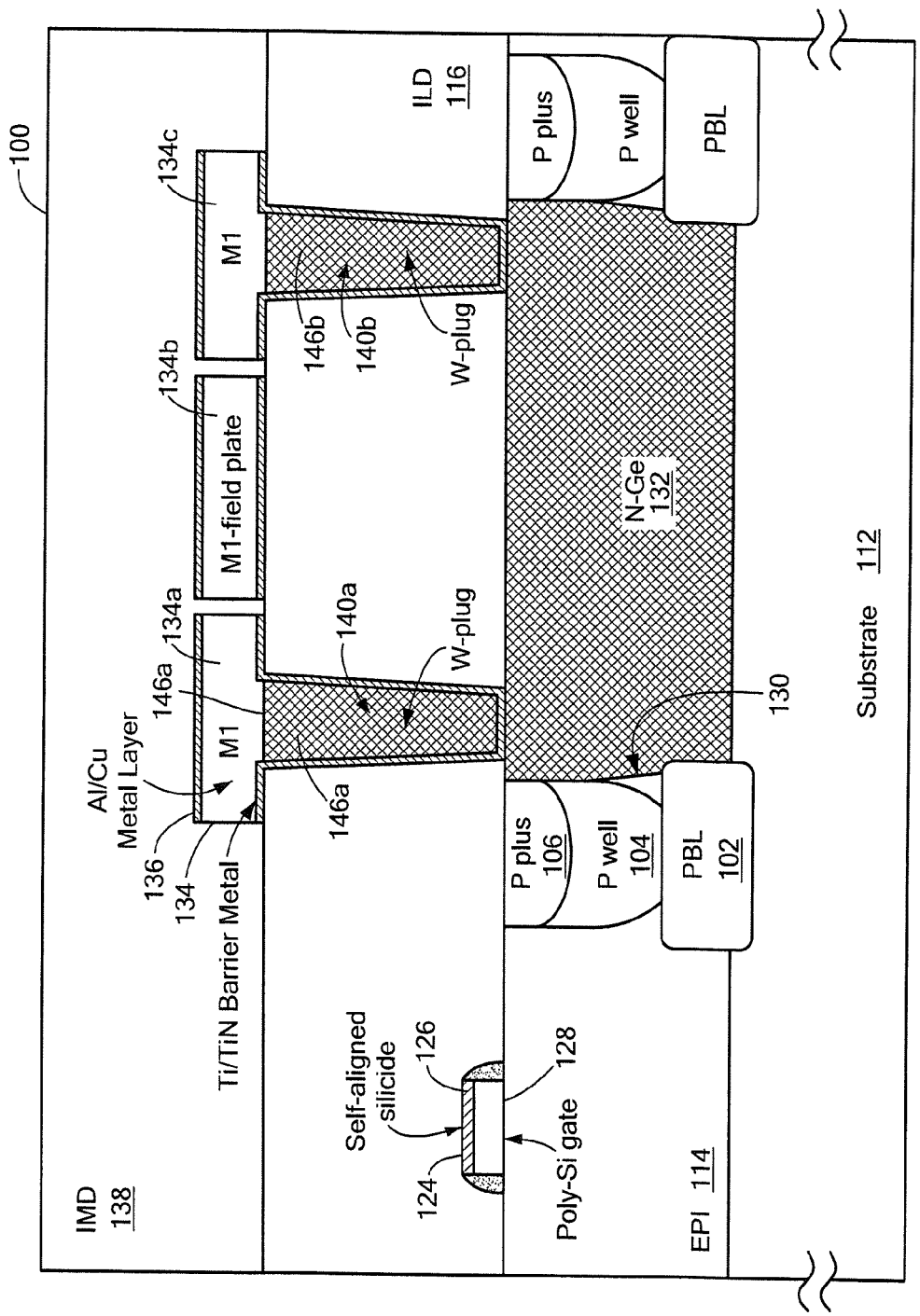
FIG. 10 is a cross-sectional view showing a structure representative of a last step of fabricating an integrated circuit, but prior to final packaging, having a second alternate embodiment of a Hall effect element.
Figure 11:
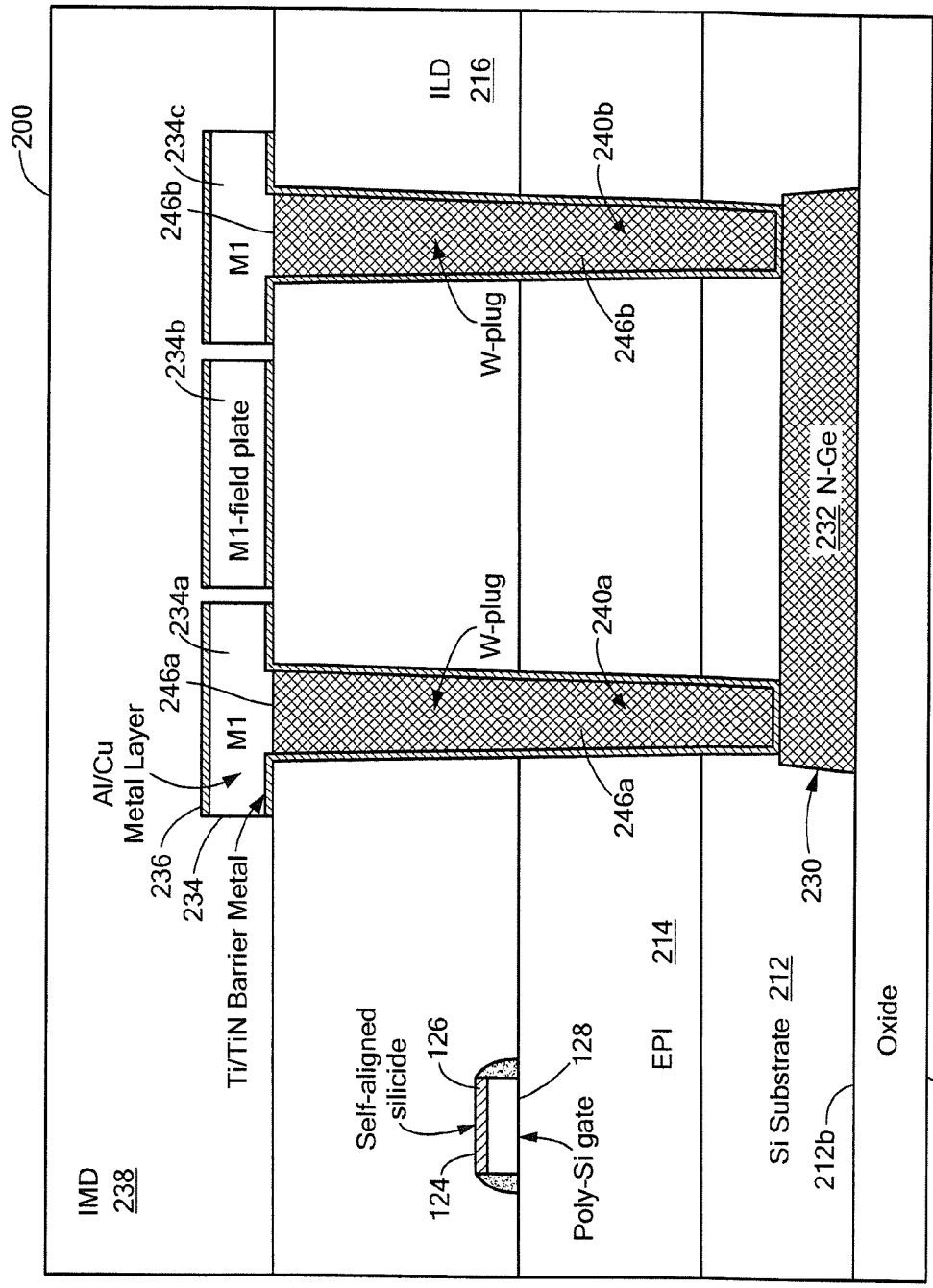
FIG. 11 is a cross-sectional view showing a structure representative of a last step of fabricating an integrated circuit, but prior to final packaging, having a third alternate embodiment of a Hall effect element.

In FIGS. 1-9, reference designations 10a-10i, respectively, refer to structures representative of progressive processing steps in the manufacture of an integrated circuit having a Hall effect element. FIGS. 8 and 9 show completed integrated circuits, but before final packaging. FIGS. 10 and 11 also show completed integrated circuits prior to final packaging, wherein preceding processing steps are not explicitly shown, but wherein the preceding processing steps will be generally understood in view of FIGS. 1-9.

It should be appreciated that, unless otherwise indicated herein, the particular sequence of steps described below is illustrative only and can be varied without departing from the spirit of the invention. Thus, unless otherwise stated the process steps described below are unordered meaning that, when possible, the steps can be performed in any convenient or desirable order.

Referring now to FIG. 1, an exemplary integrated circuit 10a is formed on a silicon substrate 12, upon which an epi layer 14 is first formed. In some embodiments, the epi layer 14 is an n-type epi layer. The substrate can be undoped or can be lightly doped with p-type material. A PLDD implant 18 can be implanted into the epi layer 14, for reasons that will become apparent from discussion below. In some embodiments, the PLDD implant 18 can be a boron doped implant, but other elements can also be used. The PLDD implant 18 forms a barrier implant layer.

The integrated circuit 10a can include electronic components, for example, a field effect transistor (FET) 24 having a polysilicon gate 28 with a silicide barrier 26. The drain and source of the FET 24 are not shown for clarity. The integrated circuit 10a can also include passive electronic components (not shown). However, the integrated circuit 10a need not include any electronic components, active or passive, other than a particular Hall effect element described more fully below.

An interlayer dielectric (ILD) layer 16 can be grown upon the epi layer 14. The ILD layer can be etched to form a cavity 22. In some embodiments, the ILD layer 16 is comprised of silicon dioxide. In other embodiments, the ILD layer 16 is comprised of silicon nitride. In still other embodiments, the ILD layer 16 can be comprised of, but is not limited to, spin-on glass or spin-on polymer, for example, polyimide, SU-8, or a benzocyclobutene (BCB) material.

A metal layer 20, for example, a titanium or titanium-nitride barrier metal layer 20, can be deposited upon the ILD layer 20 and can cover an interior surface of the cavity 33. A metal, for example, tungsten (W) or Aluminum (Al), can be deposited into the cavity 22, forming a conductive contact 23 to electronic components within the integrated circuit 10a.

The integrated circuit 10a is a starting point for forming a Hall effect element described below.

Figure 2:
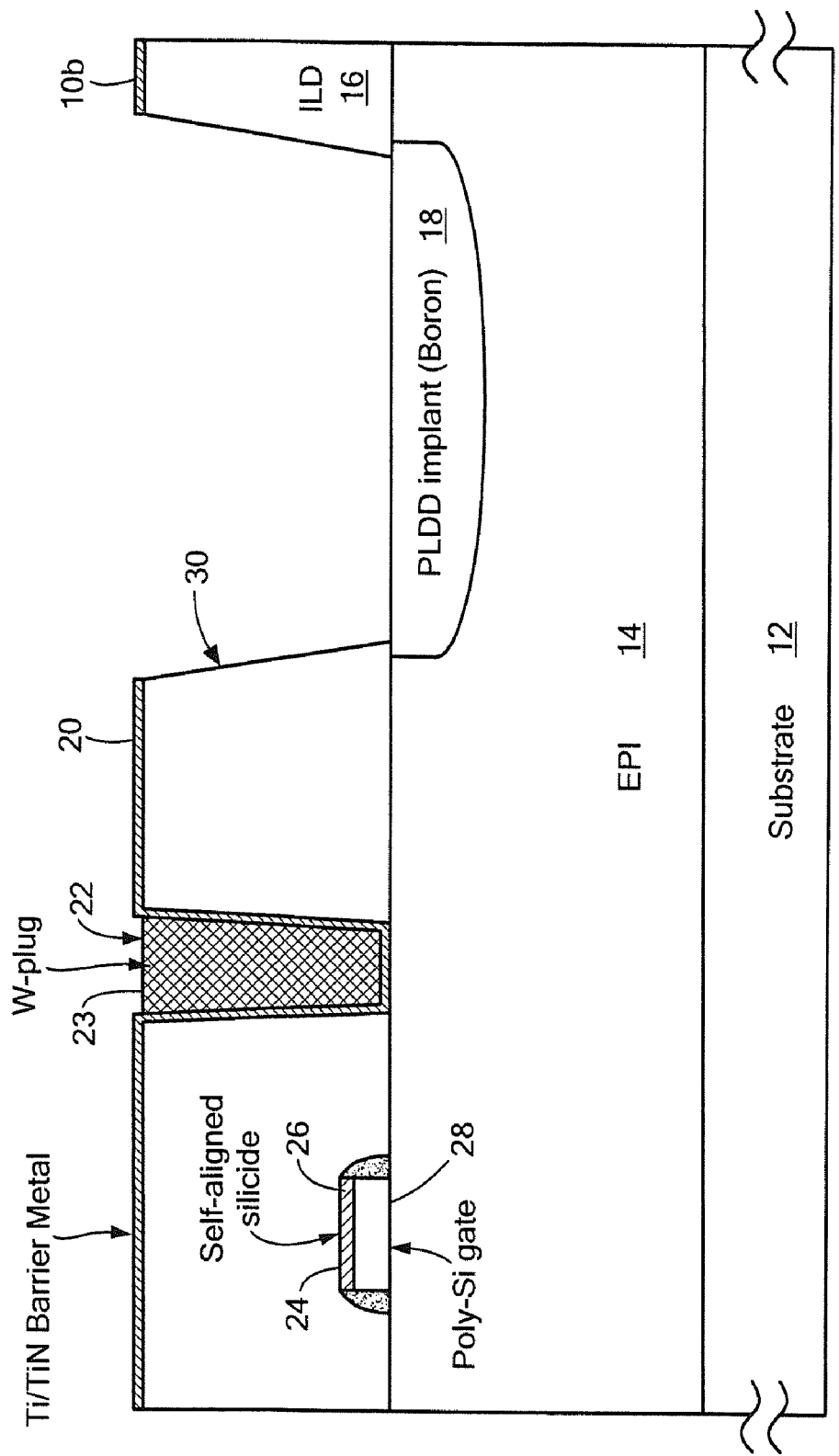
FIG. 2 is a cross-sectional view showing another intermediate structure representative of another processing step of fabricating the integrated circuit having the Hall effect element.

Referring now to FIG. 2, in which like elements of FIG. 1 are shown having like reference designations, the ILD layer 16 can be etched to form a cavity 30 to a depth of or near to a depth of the epi layer 14 and over the PLDD implant 18 to a depth of the PLDD implant 18.

Figure 3:
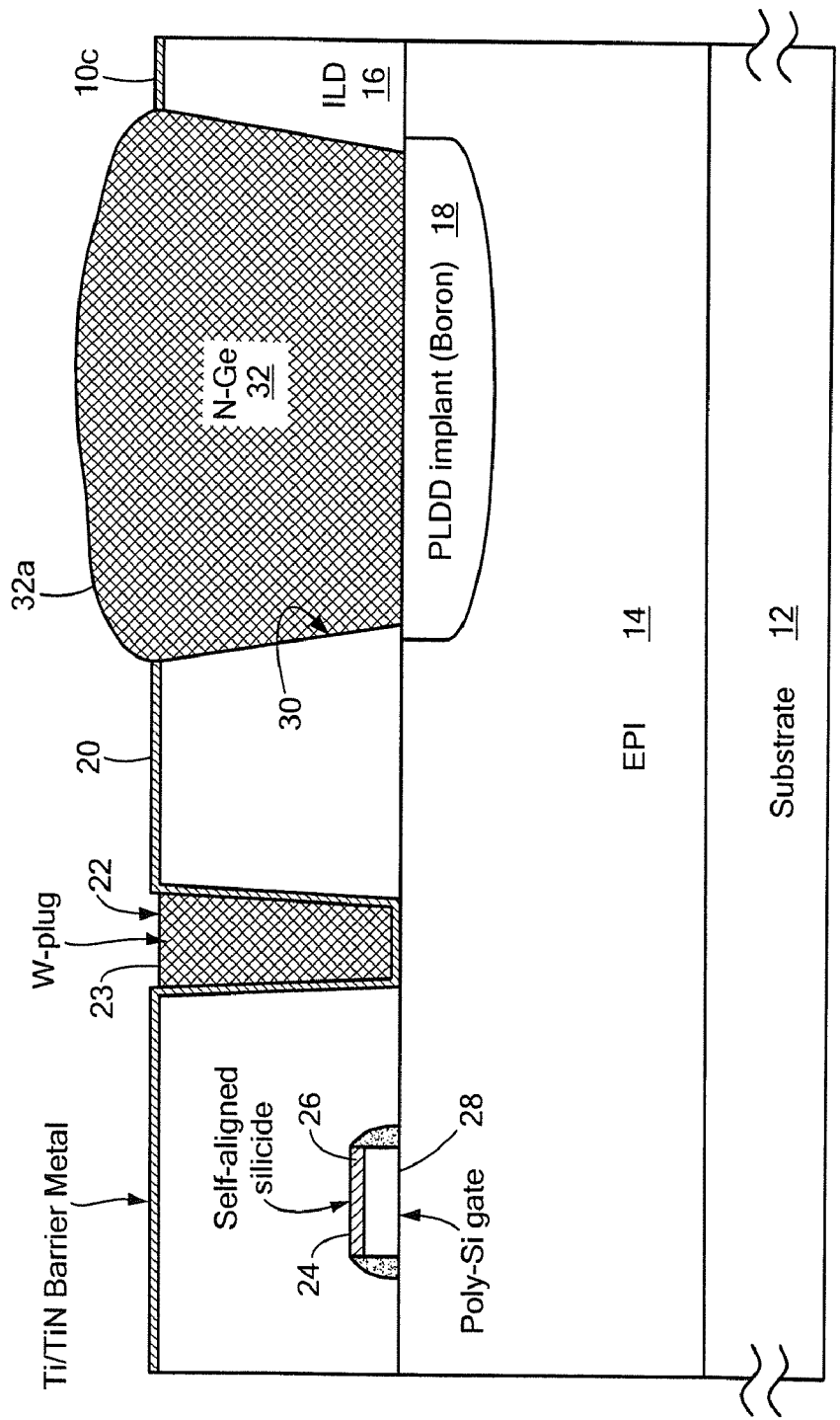
FIG. 3 is a cross-sectional view showing another intermediate structure representative of another processing step of fabricating the integrated circuit having the Hall effect element.

Referring now to FIG. 3, in which like elements of FIGS. 1 and 2 are shown having like reference designations, a germanium material, for example, and N-type germanium material, can be deposited into the cavity 30 to form a germanium structure 32. In some embodiments, the germanium material is deposited with a selective chemical deposition process, resulting in the germanium structure 32 being predominantly within the cavity 30. In other embodiments, the germanium material is a deposited with a general chemical deposition process, resulting in the germanium structure 32 being both within the cavity 30 and above a surface of the first insulating layer 16, i.e., in a region 32a. In some embodiments, the germanium structure 32 is comprised of germanium lightly doped with a metal. It will become apparent below that the germanium structure 32 forms a Hall plate of a Hall effect element.

Figure 4:
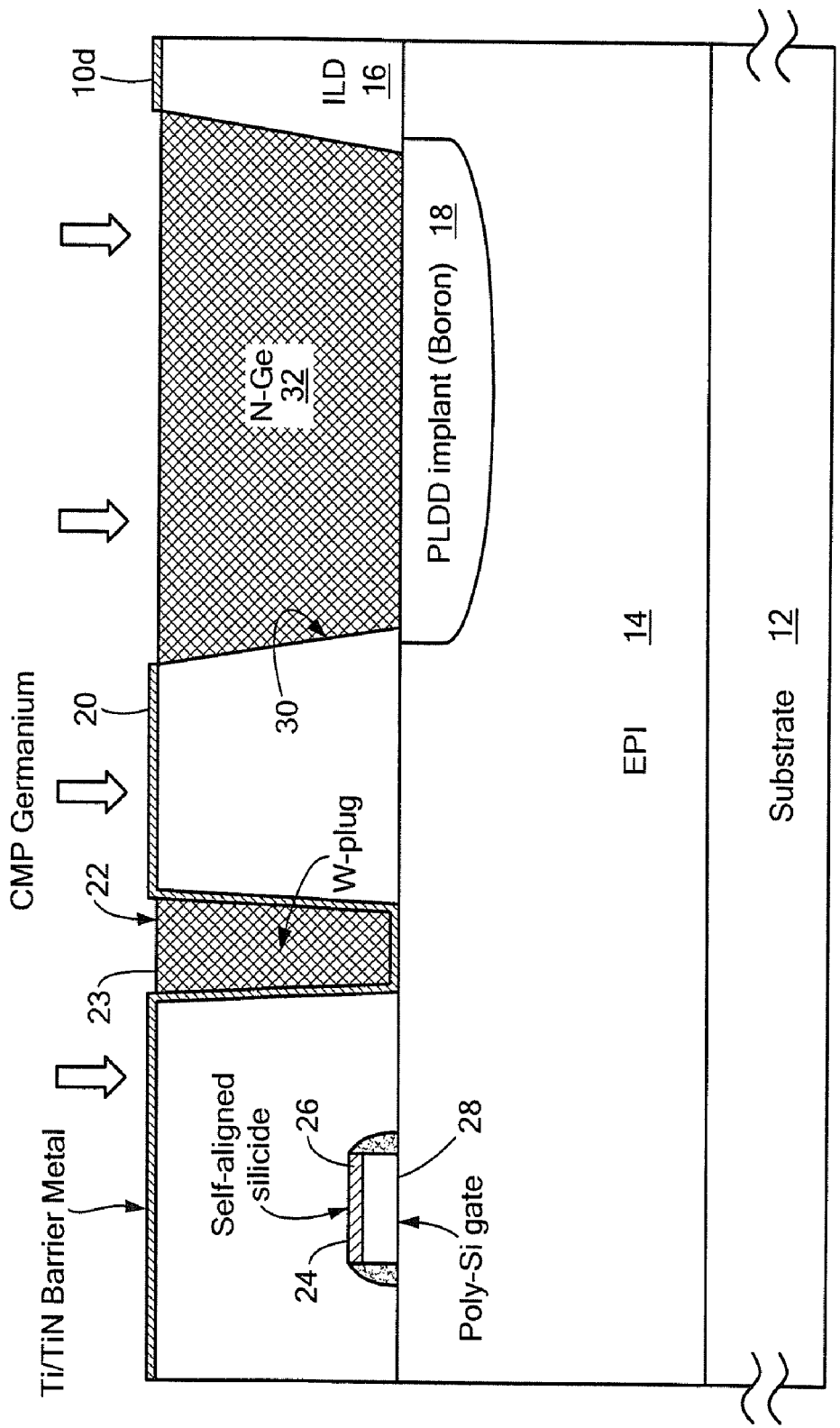
FIG. 4 is a cross-sectional view showing another intermediate structure representative of another processing step of fabricating the integrated circuit having the Hall effect element.

Referring now to FIG. 4, in which like elements of FIGS. 1-3 are shown having like reference designations, the integrated circuit 10c of FIG. 3 can be polished, for example, with a chemical mechanical polishing (CMP) process, to generate the integrated circuit 10d, for which the region 32a (FIG. 3) of the germanium material is removed to form the germanium structure 32 with a flat surface. However, in other embodiments the integrated circuit 10c is not polished and the process continues to that shown in FIG. 5.

It will be understood that the PLDD implant 18, a barrier implant layer, can operate to electrically isolate the germanium structure 32 from the epi layer 14.

Figure 5:
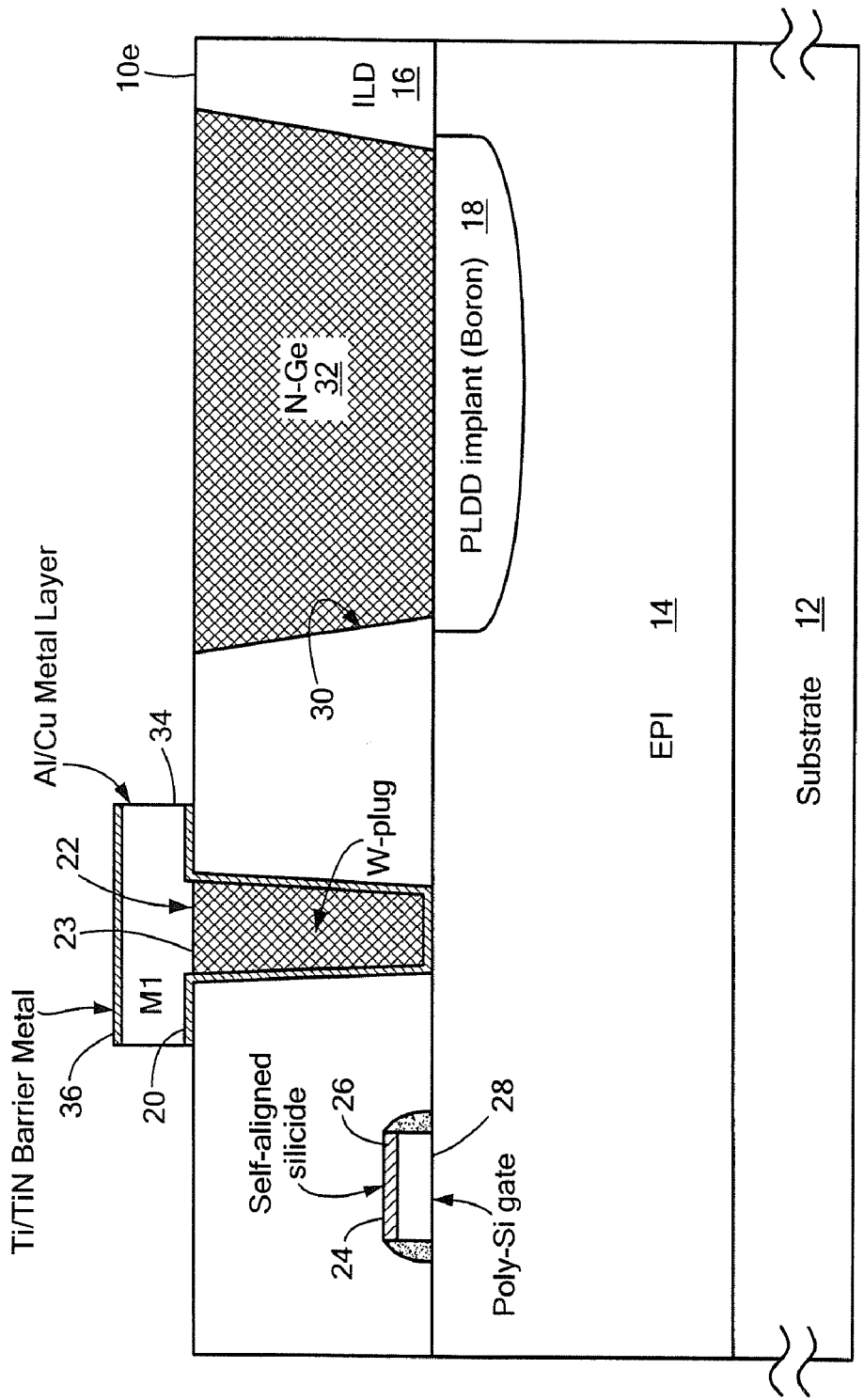
FIG. 5 is a cross-sectional view showing another intermediate structure representative of another processing step of fabricating the integrated circuit having the Hall effect element.

Referring now to FIG. 5, in which like elements of FIGS. 1-4 are shown having like reference designations, the metal layer 20 can be etched and a contact metal 34, for example, aluminum, copper, or an alloy of either, in a so-called metal one (M1) layer, can be deposited on the metal layer 20 to form a contact to the conductive contact 23. Another metal layer 36, for example, another titanium or titanium-nitride metal layer 36, can be deposited upon the metal layer 34, for example, for the purpose of anti-reflective coating during further processing.

Referring now to FIG. 6, in which like elements of FIGS. 1-5 are shown having like reference designations, an intermetal dielectric (IMD) layer 38 can be formed over the ILD layer 16 and over the metal layer 36. The IMD layer 38 can be comprised of a selected one of silicon dioxide, a polymer (for example, polyimide, SU-8, or a benzocyclobutene (BCB) material), silicon nitride, or spin-on glass. The IMD layer 28 can be etched to form cavities 42, 40a, 40b. The cavities 40a, 40b have respective contact regions 32a, 32b proximate to the germanium structure 32.

Referring now to FIG. 7, in which like elements of FIGS. 1-6 are shown having like reference designations, a metal layer 50, which can be another titanium or titanium-nitride barrier metal layer 50, can be deposited over the IMD layer 38 and into the cavities 42, 40a, 40b. A metal, for example, tungsten, aluminum, or copper, can be deposited to fill the cavities 42, 40a, 40b to form conductive contacts 44, 46a, 46b, respectively. The conductive contacts 46a, 46b are Hall cell contacts that contact with the germanium structure 32, which, as described above, forms a Hall plate of a Hall effect element While two conductive contacts 46a, 46b are shown, it should be recognized that more conductive contacts can be formed to contact the germanium structure 32 at other contact points.

Referring now to FIG. 8, in which like elements of FIGS. 1-7 are shown having like reference designations, another metal layer 48, a so-called metal two (M2) layer, for example, aluminum, copper, or an alloy of either, can be deposited over the IMD layer 38 and over the metal layer 50. The metal layer 48 can be etched to form regions 48a, 48b, 48c. The region 48b can form a field plate of the Hall effect element. The regions 48a, 48c can couple the conductive contacts 46a, 46b, respectively, i.e., the Hall plate 32, to other circuit elements. Another metal layer 52, which can be another titanium or titanium-nitride barrier metal layer 52, can be deposited over the metal layer 48.

The Hall effect element is completed, and has the Hall plate 32, the field plate 48b, and a plurality of conductive contacts 46a, 46b to the Hall plate 32.

In embodiments, shown, the Hall plate 32 is made from an N-type germanium material, which is known to have a higher mobility than a silicon material. Thus, the Hall effect element that has the N-type Hall plate 32 has higher sensitivity than a conventional Hall effect element that has a silicon Hall plate.

P-type germanium material is also known to have higher mobility than a silicon material (but not as high as N-type germanium). Thus, in other embodiments, the Hall plate 32 can be formed from P-type germanium material and still result in a Hall effect element superior to (i.e., with a higher sensitivity than) a Hall effect element that has a silicon Hall plate.

The Hall plate 32 and the field plate 48b shown in side view can, from a top view, have any shapes, for example, round, rectangular, square, octagon, or cross shapes.

Referring now to FIG. 9, in which like elements of FIGS. 1-8 are shown having like reference designations, in a first alternate embodiment, the M1 layer 34 is instead formed and etched into regions 34a, 34b. The region 34b forms a field plate 34b in place of the field plate 48b of FIG. 8.

In order to avoid electrical conduction between the Hall plate 32 and the field plate 34b, an interlayer dielectric (ILD2) layer 54 can be formed between the Hall plate 32 and the M1 layer 34. In some embodiments, the ILD2 layer 54 is comprised of silicon dioxide. In other embodiments, the ILD2 layer 54 is comprised of silicon nitride. In still other embodiments, the ILD2 layer 54 can be comprised of but is not limited to, spin-on glass, or a spin-on polymer, for example, polyimide, SU-8, or a benzocyclobutene (BCB) material.

FIGS. 10 and 11 show second and third alternate embodiments of Hall effect elements that have germanium Hall plates. The various process steps to achieve the integrated circuits and the associated Hall effect elements of FIGS. 10 and 11 are not shown but will be understood, particularly in view of the discussion of FIGS. 1-9 above.

Referring now to FIG. 10, an integrated circuit 100 includes a substrate 112, an epi layer 114, an ILD layer 116, an IMD layer 138, and an M1 layer 134, all with corresponding elements in FIGS. 1-9. The integrated circuit 100 also includes a germanium structure 132, i.e., a Hall plate 132, formed within the epi layer 114, unlike the germanium structure 32 of FIGS. 1-9, which is formed within the ILD layer 16. In this arrangement, when the germanium structure 132 is comprised of N-type germanium, the germanium structure 132 can be isolated from the epi layer 114 with a P-type barrier layer (PBL) 102, a P-well 104 above the P-type barrier layer 102, and a P+ region 108 above the P-well 104.

In some embodiments, the germanium structure 132 is formed in a cavity 130 formed by a trench process using an isotropic etchant, resulting in the cavity 130 having nearly vertical sidewalls to a depth of about six to about ten microns into the epi layer 114. A so-called Bosch process is described below.

Conductive contacts 146a, 146b are formed in and through an ILD layer 116, unlike the conductive contacts of FIGS. 8 and 9, which are formed in and through the IMD layer 38.

In a top view, the P-type barrier layer (PBL) 102, the P-well 104, and the P+ region 108 can have shapes to match the top view shape of the germanium structure 132, for example, round or rectangular.

A field plate 134b is formed in the metal one (M1) layer 134. However, in other embodiments the field plate can be formed in the metal two (M2) layer as shown, for example, in FIG. 8.

Referring now to FIG. 11, an integrated circuit 200 includes a substrate 212, an epi layer 214, an ILD layer 216, an IMD layer 238, and an M1 layer 234, all with corresponding elements in FIGS. 1-10. The integrated circuit 200 includes a germanium structure 232, i.e., a Hall plate 232, formed within a second surface 212b of the silicon substrate 212, unlike the germanium structure 32 of FIGS. 1-9, which is formed within the ILD layer 16.

Conductive contacts 246a, 246b are formed in and through the ILD layer 216, in and through the epi layer 214, and in and through much of a silicon substrate 212. This is unlike the conductive contacts of FIGS. 8 and 9, which are formed in and through only the IMD layer 38 (and other process layers above the IMD layer 38).

The substrate 212 has first and second opposing surfaces 212a, 212b respectively. The electronic component 124 is proximate to the first surface 212a and the germanium structure is formed in the second surface 212b. Optionally, an insulating layer 250, for example, and oxide layer, can be formed over the second surface 212b of the substrate 212, in order to electrically isolate the substrate 212 and the Hall plate 232 from a mounting structure (not shown) to which the integrated circuit 200 attaches.

It will be recognized that the structures, in particular, the silicon substrate 212, are not shown to relative scale. For example, the silicon substrate 212 can be about one hundred to about eight hundred microns thick and the germanium structure 232 can be about two microns to about ten microns thick. Thus, the germanium structure 232 is near to the second surface 212b of the substrate, and not near to the first surface 212a.

In view of the above, it will be understood that the conductive contacts 246a, 246b, and, in particular, cavities 240a, 240b in which the conductive contacts 246a, 246b are formed, must be etched through a significant amount of material. To this end, a method sometimes referred to as a "Bosch process" can be used. The Bosch process uses an isotropic etch followed by passivation with a polytetrafluoroethylene (PTFE) layer, followed by another etch, which steps are repeated until a desired depth is achieved. The Bosch process can achieve deep cavities with nearly vertical sidewalls, as are desirable for the cavities 240a, 240b. The Bosch process is described in one or more patents assigned to Robert Bosch GmbH, for example, U.S. Pat. No. 6,284,148, issued Sep. 4, 2001, or U.S. Pat. No. 6,303,512 issued Oct. 16, 2001.

A field plate 234b is formed in a metal one (M1) layer 234. However, in other embodiments the field plate can be formed in the metal two (M2) layer as shown, for example, in FIG. 8.

While the cavity 230 is shown to be formed in the second surface 212b, i.e., in the backside, of the substrate 212, in other embodiments, it is also possible to form the cavity 230 in the first surface 212a of the substrate 212. For these embodiments, the germanium structure 232 is proximate to the first surface 212a of the substrate 212.

All references cited herein are hereby incorporated herein by reference in their entirety. Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A method of fabricating an integrated circuit, wherein the method of fabricating the integrated circuit comprises fabricating a Hall effect element, wherein the fabricating the Hall effect element comprises:
   forming an epi layer over a silicon substrate;
   forming a first insulating layer over the epi layer;
   forming a cavity in at least one of the first insulating layer, the epi layer, or the substrate; and
   depositing germanium into the cavity to form a germanium structure corresponding to a Hall plate of the Hall effect element.

2. The method of claim 1, wherein the fabricating the integrated circuit further comprises fabricating an electronic component in or over the silicon substrate.

3. The method of claim 2, wherein the depositing the germanium into the cavity comprises depositing n-type germanium into the cavity.

4. The method of claim 2, further comprising:
   polishing to remove excess germanium, resulting in the germanium structure disposed within the cavity.

5. The method of claim 4, further comprising:
   forming a metal layer over the first insulating layer.

6. The method of claim 2, wherein the fabricating the Hall effect element further comprises:
   forming a second insulating layer over the first insulating layer and over the germanium structure;
   etching at least one of the first insulating layer, the second insulating layer, the epi layer, or the substrate to a depth proximate to the germanium structure, resulting in a plurality of contact cavities disposed over the germanium structure;
   filling the plurality of contact cavities with a conductive material to form a plurality of conductive contacts; and
   forming a conductive layer over the germanium structure at least in a region between the plurality of conductive contacts, wherein the conductive layer forms a field plate of the Hall effect element.

7. The method of claim 6, wherein the conductive layer is formed over the second insulating layer.

8. The method of claim 6, wherein the conductive layer is formed over the gemianium structure and under the second insulating layer.

9. The method of claim 6, wherein the depositing the germanium into the cavity comprises depositing the germanium into the cavity with a selective chemical deposition process, resulting in the germanium being predominantly within the cavity.

10. The method of claim 6, wherein the depositing the germanium into the cavity comprises depositing the germanium into the cavity with a general chemical deposition process, resulting in the germanium both within the cavity and above a surface of the first insulating layer.

11. The method of claim 6, wherein the fabricating the Hall effect element further comprises diffusing a barrier implant layer into the epi layer between the epi layer and the germanium structure.

12. The method of claim 6, wherein the fabricating the Hall effect element further comprises depositing a plurality of conductive structures coupled to the plurality of conductive contacts, the plurality of conductive structures configured to couple the Hall effect element to other circuits.

13. The method of claim 6, wherein the plurality of conductive contacts are comprised of Tungsten.

14. The method of claim 6, wherein the plurality of conductive contacts are comprised of Aluminum.

15. The method of claim 6, wherein the first insulating layer is comprised of silicon dioxide.

16. The method of claim 6, wherein the first insulating layer is comprised of a silicon nitride, a spin-on glass, or a polymer.

17. The method of claim 6, wherein the second insulting layer is comprised of silicon dioxide.

18. The method of claim 6, wherein the second insulating layer is comprised of a polymer, silicon nitride, or spin-on glass.

19. The method of claim 2, wherein the forming the cavity comprises forming the cavity in the substrate, wherein the substrate has first and second opposing surfaces, and wherein the electronic component is proximate to the first surface and the germanium structure is formed in the second surface.

20. An integrated circuit comprising a Hall effect element, wherein the Hall effect element comprises:
   a silicon substrate comprising first and second opposing surface;
   an epi layer disposed over the first surface of the silicon substrate;
   a first insulating layer disposed over the epi layer;
   a cavity formed in at least one of the first insulating layer, the epi layer, or the substrate; and
   a germanium structure comprised of germanium disposed within the cavity, wherein the germanium structure corresponds to a germanium Hall plate of the Hall effect element.

21. The integrated circuit of claim 20 further comprising an electronic component disposed in or over the silicon substrate.

22. The integrated circuit of claim 21, wherein the germanium comprises n-type germanium.

23. The integrated circuit of claim 21, wherein the Hall effect element further comprises:
   a second insulating layer disposed over the first insulating layer and over the germanium structure;
   a plurality of conductive contacts disposed through at last one of the first insulating layer, the second insulating layer, the epi layer, or the substrate so as to contact the germanium structure at a plurality of contact locations; and
   a conductive layer disposed over the germanium structure at least in a region between the plurality of conductive contacts, wherein the conductive layer forms a field plate of the Hall effect element.

24. The integrated circuit of claim 23, wherein the conductive layer is disposed over the second insulating layer.

25. The integrated circuit of claim 23, wherein the conductive layer is disposed over the germanium structure and under the second insulating layer.

26. The integrated circuit of claim 23, wherein the conductive layer comprises a metal layer.

27. The integrated circuit of claim 23, wherein the germanium structure is comprised of germanium lightly doped with a metal.

28. The integrated circuit of claim 23, wherein the Hall effect element further comprises a barrier implant layer diffused into the epi layer between the epi layer and the germanium structure.

29. The integrated circuit of claim 23, wherein the Hall effect element further comprises a plurality of conductive structures coupled to the plurality of conductive contacts, the plurality of conductive structures configured to couple the Hall effect element to other circuits.

30. The integrated circuit of claim 23, wherein the plurality of conductive contacts are comprised of Tungsten.

31. The integrated circuit of claim 23, wherein the plurality of conductive contacts are comprised of Aluminum.

32. The integrated circuit of claim 23, wherein the first insulating layer is comprised of silicon dioxide.

33. The integrated circuit of claim 23, wherein the first insulating layer is comprised of silicon nitride, spin-on glass, or a polymer.

34. The integrated circuit of claim 23, wherein the second insulating layer is comprised of silicon dioxide.

35. The integrated circuit of claim 23, wherein the second insulating layer is comprised of a polymer, silicon nitride, or spin-on glass.

36. The integrated circuit of claim 21, wherein the cavity is formed in the substrate, and wherein the electronic component is proximate to the first surface of the substrate and the germanium structure is formed in the second surface of the substrate.

* * * * *

UNITED STATES PATENT AND TRADEMARK OFFICE
CERTIFICATE OF CORRECTION

| | | |
|---|---|---|
| PATENT NO. | : 8,384,183 B2 | Page 1 of 1 |
| APPLICATION NO. | : 12/708855 | |
| DATED | : February 26, 2013 | |
| INVENTOR(S) | : Harianto Wong et al. | |

It is certified that error appears in the above-identified patent and that said Letters Patent is hereby corrected as shown below:

In the Claims

Column 8, line 66 delete "insulting" and replace with --insulating--.

Column 9, line 32 delete "through at last" and replace with --through at least--.

Signed and Sealed this
Eleventh Day of August, 2015

Michelle K. Lee
*Director of the United States Patent and Trademark Office*